United States Patent [19]

Etienne et al.

[11] 4,160,166
[45] Jul. 3, 1979

[54] SYSTEM FOR REGULATING MOLECULAR FLUX AND ITS APPLICATION TO CO-EVAPORATION TECHNIQUES

[75] Inventors: Patrick Etienne; Jean Massies; Nguyen T. Linh, all of Paris, France

[73] Assignee: Thomson-CSF, Paris, France

[21] Appl. No.: 847,907

[22] Filed: Nov. 2, 1977

[30] Foreign Application Priority Data

Nov. 5, 1976 [FR] France ............................... 76 33471

[51] Int. Cl.² .............................................. H01J 27/00
[52] U.S. Cl. .............................. 250/423 R; 148/175; 250/492 A
[58] Field of Search ........................... 250/423, 492 A; 148/175

[56] References Cited
PUBLICATIONS

"Fabrication for Multilayer Semiconductor Devices" by Chang et al., IBM Tech. Discl. Bull., vol. 15, No. 2, 7-72, pp. 365-366.

*Primary Examiner*—Harold A. Dixon
*Attorney, Agent, or Firm*—Oblon, Fisher, Spivak, McClelland & Maier

[57] ABSTRACT

A system for automatic regulation of the density of a given molecular type at a pre-arranged point in an apparatus called a "flux or molecular jet", intended to make epitaxy layers. In a vacuum enclosure a probe for mass spectrometry analysis (electrostatic, four pole apparatus) picks up the types projected by evaporating units, ionizes them, filters and detects them as a function of their respective masses. The heating in each unit is regulated by a servo-control loop which contains means for analyzing the type concerned.

6 Claims, 2 Drawing Figures

SYSTEM FOR REGULATING MOLECULAR FLUX AND ITS APPLICATION TO CO-EVAPORATION TECHNIQUES

The invention covers a system for regulating molecular flux and its application to co-evaporation techniques. The molecular fluxes or jets coming from evaporating units under very low pressure are used in particular to obtain an epitaxial deposit of very thin layers of semiconductor materials.

In this technique, evaporable materials are used (arsenic and gallium for example). These are placed in micro-ovens (evaporating units) which are heated electrically. The evaporating units have a relatively large opening arranged in such a way that the molecular jet is directed towards a target (an epitaxial substrate for example) while the complete assembly comprises a vacuum enclosure (residual pressure of $10^{-10}$ to $10^{-6}$ Torr). The regulation of the molecular fluxes coming from the various units is very important because their ratio has a determining influence on the composition of the deposit which forms on the target surface when the adhesion coefficient of the evaporated material is taken into account. In particular the stoechiometry at the epitaxial growth interface plays a vital role in the performance of the semiconductor devices obtained. However, the classical system for regulating the molecular flux consists in enslaving the temperature of each micro-oven to a predetermined value and comparing this value with the value obtained with a thermocouple. The servo-control loop is closed by the control organ of an electric power supply source which is applied to the heater resistor in each micro-oven. This regulation system has various drawbacks:

(a) lack of reproducibility as far as the molecular flux corresponding to a given temperature in the micro-oven is concerned; large deviations are obtained, for the same temperature, between two identical units during the evaporation of a material, which is placed in some quantity in the micro-oven;

(b) difficulty in adjustment due to the system inertia; there is far too big a delay between the recording of a temperature and the response in molecular flux;

(c) there is no possibility of adjusting the two fluxes one with respect to the other.

Finally, in the case of gallium arsenide, the arsenic vapours attack the thermocouple sleeve and cause damage.

The invention aims to correct these disadvantages.

According to the invention, there is provided a system for regulating molecular flux, including a vacuum enclosure, units for evaporating a molecular jet turned towards a sample-holder intended to receive an epitaxy substrate, and a gas analyzer using mass spectrometry intended to supply an electric signal measuring the content of said flux in a given molecular type, said system comprising at least one servo-control loop which includes electronic means that enable an error signal to be produced by comparison of said signal with predetermined value of said flux to be controled as a function of said error signal.

The invention will be better understood and other characteristics will appear from the description which follows and the drawings accompanying it. Among the latter:

Figure 1:
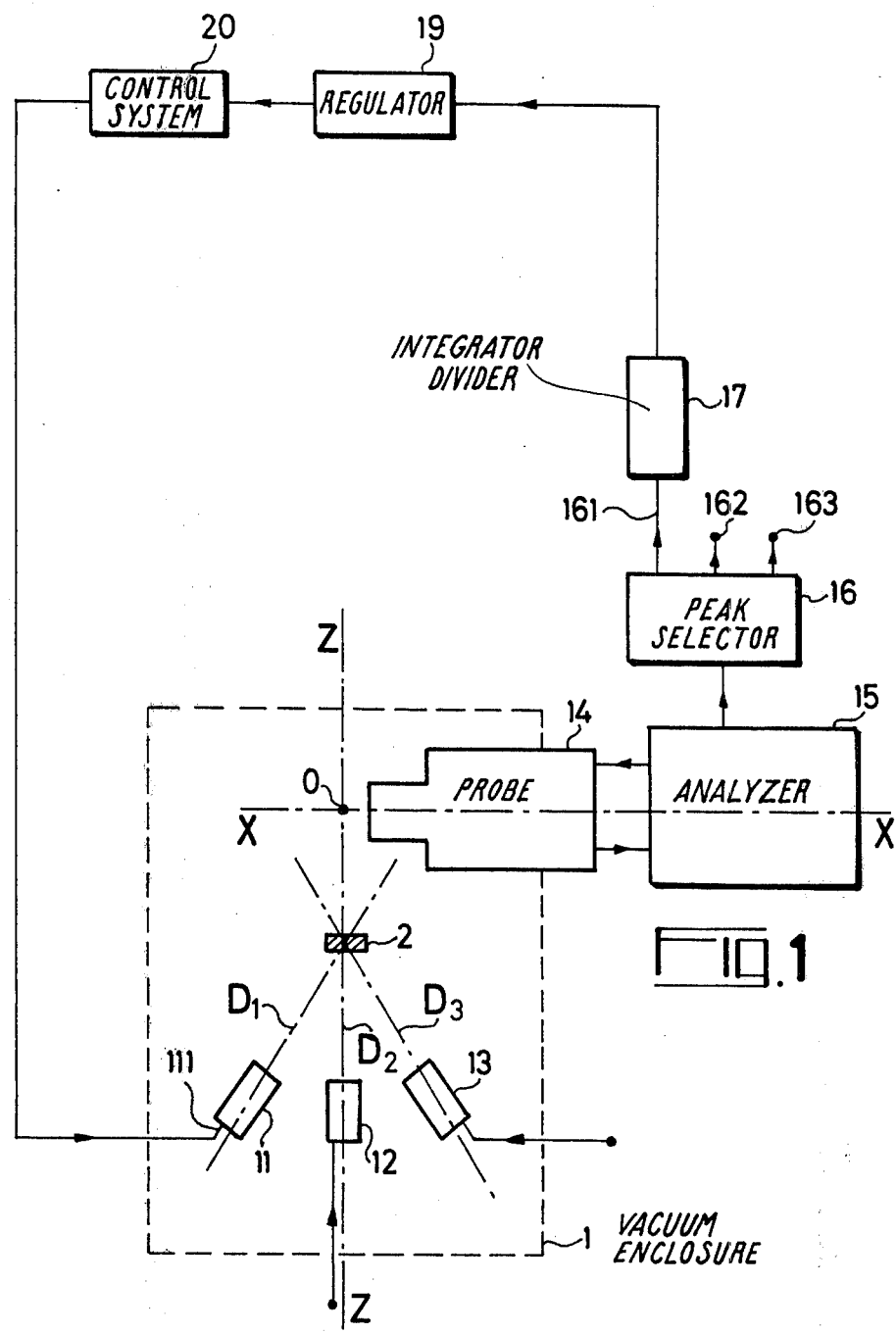
FIG. 1 shows schematically an example of an embodiment of the system in accordance with the invention in the case in which the servo-control loops are independant for the various types of molecules.

In the first example of production (FIG. 1), an installation for epitaxy by molecular jets is shown schematically. It contains a very low pressure enclosure 1, represented symbolically by a rectangle of dashes. None of the apparatuses intended to produce the vacuum properly speaking (primary and secondary pumps, possible liquid nitrogen traps and titanium sublimation devices) has been shown any more than the valve-airlock device which enables the sample to be processed to be changed while the rest of the enclosure is kept at the very low pressure.

A certain number of evaporation units (micro-ovens) are installed in such a way that their molecular fluxes converge to the same point on the ZZ axis of the vacuum chamber. In the example chosen, three units, 11, 12 and 13, of the type with a large opening, have their axes along three directions $D_1$, $D_2$ and $D_3$ that converge on a sample-holder 2.

A mass spectrometry gas analyzer is installed in such a way as to have a probe 14 near a point O on the axis ZZ of the vacuum chamber, on the opposite side, for example, to the pumping devices (not shown). This probe is of the four pole structure type for example in which the XX axis cuts the ZZ axis at the point O.

For a proper understanding of the invention, the theory of a four pole structure analyzer is given below. Ions are produced from molecules or atoms of gas (or vapour) by a source of accelerated electrons inside the probe 14. The ions are themselves accelerated by suitably polarized electrodes and then focussed along the axis of an ion optical device. This optical device contains, in the case of a four pole structure, four parallel bars symmetrically arranged with respect to an axis which is also parallel to them. These bars are subjected to potentials which are partly D.C ($\pm U$) and partly A.C ($\pm V_o \cos \omega t$). A sweep device contained in an analyzer drawer 15 acts on voltages U and $V_o$ in such a way that a condition, called the trajectory stability condition, is satisfied for a given pair of voltages when the ion has a certain mass. The combined sweep of the voltages enabling the ions of variable mass to be "filtered" continuously is called the mass sweep.

When the trajectory stability condition is satisfied, the ions of a given mass pass through the structure and are collected at the output by a collector-detector included in probe 14. The current detected is transmitted by drawer 15 to an electronic analysis device 16 called the peak selector. Selector 16 has a number of variable outputs, three (161, 162 and 163) in the example shown. These outputs are preadjusted to coincide with the masses of the kinds emitted by units 11, 12 and 13.

In the case of epitaxy by a flux of arsenic and gallium, only two evaporating units and two outputs of peak selector 16 are used.

Only one servo-control loop of the three possible in the schematic in FIG. 1 is described below. This loop connects, for example, output 161 of selector 16 to the input 111 for heating (by an electrical resistor) unit 11. Similar loops connect output 162 to the input 121 of unit 12 and output 163 to the input 131 of unit 13.

This servo-control loop contains:

an integrator divider which is able, according to a classical schematic, to convert the periodical current pulses resulting from the "mass" sweep into a direct voltage to give a mean measurement of the flow emitted by unit 11;

a triple action (proportional, integral and derived) regulator 19 of classical type with three independant adjustments; this regulator, in classical fashion, has a comparator stage whose equilibrium is adjustable as a function of a predetermined value;

a control system 20 containing thyristors feeding unit 11 electrically.

The loop functions as follows. As long as the molecular flux in the space considered is such that the voltage supplied by integrator divider 17 is less than a predetermined value, the voltage supplied by regulator 19 is not high enough to cut off the supply coming from system 20, and unit 11 continues to be heated in such a way that it emits an increasing molecular flux. When the flux exceeds a certain value (adjusted by trial and error) the voltages supplied become such that the power supply to unit 11 is cut off. The molecular flux decreases and there is a certain stability helped by the action of the regulator 19.

In a real example of a production, such a loop makes it possible to adjust the gallium flux to ±1% and the arsenic flux to ±3% independantly one of the other.

Figure 2:
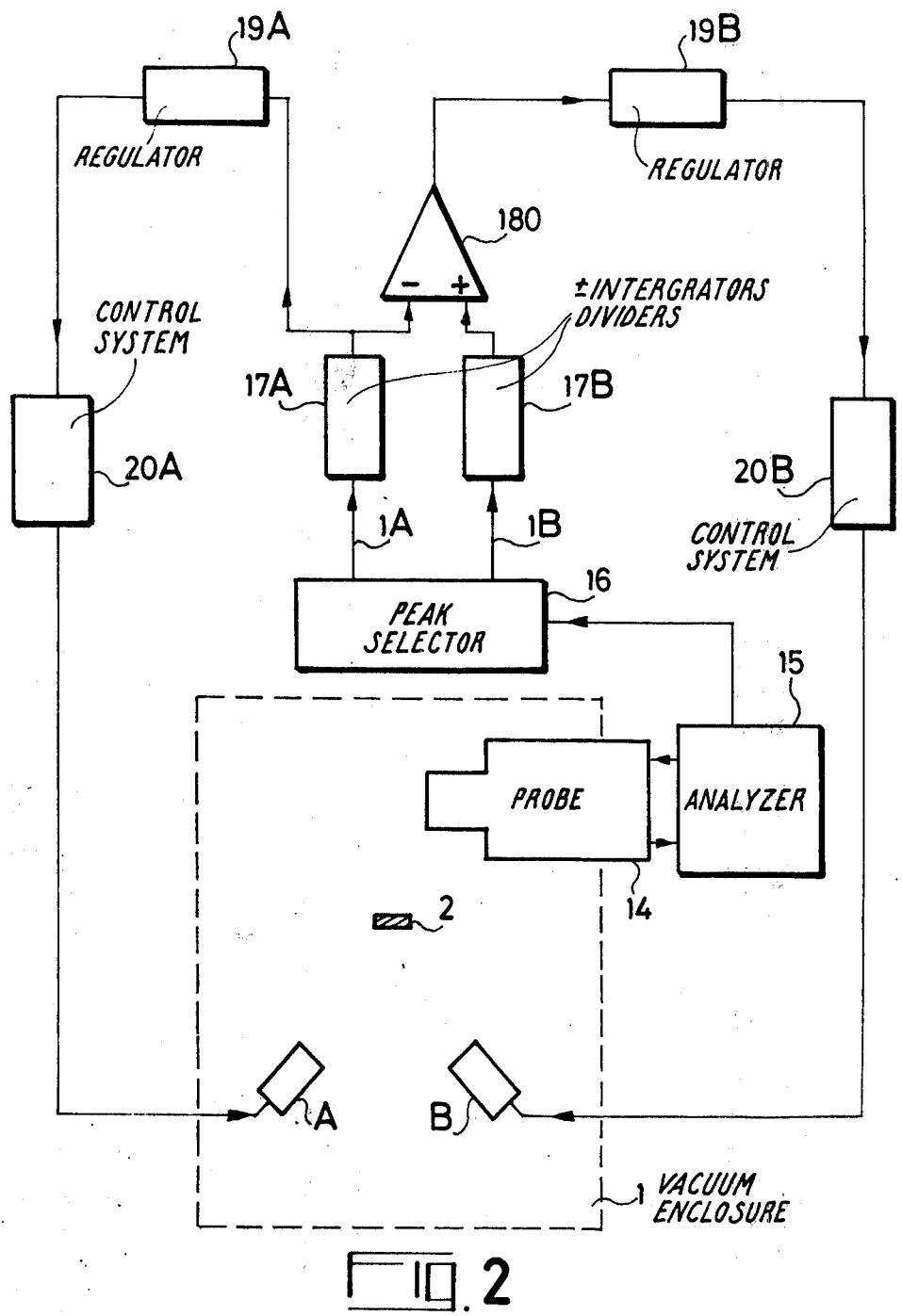
FIG. 2 shows schematically an example of an embodiment of the system in accordance with the invention in the case in which the servo-control loops are not independant.

In another example of a production, in FIG. 2 are shown two evaporating units A and B instead of three in order to show more clearly the dependance of the two servo-control loops which characterize this production. The intention sought is to adjust the flux coming from unit B (which will be called flux B) so as to keep the ratio of flux B constant with respect to the flux coming from unit A (flux A).

For this purpose, the same regulation system (loop A) is produced for flux A as that which was described in the first example for unit 11. An integrator divider 17A has its input connected to an output 1A of a selector 16 and its output connected to the input of a regulator 19A which is itself connected to a control system 20A acting on unit A.

However, the servo-control loop for unit B (loop B) is different. In loop B, organs 17b, 19b and 20B are similar and similarly placed but, on the other hand, at the input of regulator 19B, there is a comparator 180 (a differential amplifier with a gain of 1 for example) whose (+) input is connected to the output of integrator divider 17B while its (−) input is connected to the output of integrator divider 17A (in parallel with the input of regulator 19A).

The operation is as described below.

Let $V_A$ and $V_B$ be the output voltages of items 17A and 17B. Let $V_o$ be the output voltage of comparator 180.

In the case in which regulator 19B can operate on one side or the other of zero, the comparator is adjusted with zero offset and $$V_o = V_B - V_A \quad (1)$$

However, if $K_A$ and $K_B$ are the divider coefficients of items 17A and 17B and "flux A" and "flux B" the signals coming from outputs $1_A$ and $1_B$, then:

$$V_A = K_A \times \text{flux } A \quad (2)$$

$$V_B = K_B \times \text{flux } B \quad (3)$$

When $$V_o = O \quad (4)$$

then $$V_B = V_A \quad (5)$$

and hence:

$K_B \times \text{flux } B = K_A \times \text{flux } A$ which can be written in the form:

$$\frac{\text{flux } B}{\text{flux } A} = \frac{K_A}{K_B} \quad (6)$$

In the case in which this equality is observed, the flux ratio is given by the ratio:

$$K = \frac{K_A}{K_B} \quad (7)$$

In practice, the coefficients $K_A$ and $K_B$ will be chosen to give the required ratio value, 1 for example in the epitaxy of GaAs.

The choice of the coefficients $K_A$ and $K_B$ is determined by the construction and later by the adjustment of integrators dividers 17A and 17B.

In the case of adjustment on one side and the other of a value other than zero, 10 mV for example, the offset of comparator 180 is adjusted in consequence. This gives:

$$V_o = K_B \times \text{flux } B - K_A \times \text{flux } A + 10 \text{ mV} \quad (8)$$

Three cases have to be examined:

FIRST:

$K_B \times \text{flux } B > K_A \times \text{flux } A$ which gives:
$V_o > 10 \text{mV}$

SECOND:

$K_B \times \text{flux } B < K_A \times \text{flux } A$ which gives:
$V_o < 10 \text{mV}$

THIRD:

$K_B \times \text{flux } B = K_A \times \text{flux } A$ which gives:
$V_o = 10 \text{mV}$.

If 10mV is fixed as the predetermined value on regulator 19B, the servo-control loop will tend to produce equilibrium, i.e. the equality of the third case.

This is the same as the preceding case and the choice of the coefficient $K_A$ and $K_B$ will be the same.

The use of mass spectrometry gas analyzers based on a principle different from that of the four pole one is within the scope of the invention. This is the case of analyzers with a magnetic field, analyzers with acceleration by a high frequency electric field, analyzers with an electric field and time of flight and single pole, electric field analyzers.

The invention is applicable to co-evaporation for the production of:

either thin layer deposits, to obtain metallic contacts for example, or epitaxial layers on semiconductor substrates.

What we claim is:

1. A system for regulating molecular flux, including a vacuum enclosure, units for evaporating a molecular jet turned towards a sample-holder intended to receive an epitaxy substrate, a gas analyzer consisting of a mass sweep device coupled to a peak selector able to supply n signals, n being a whole number greater than or equal to two, which measure the flux content in n predetermined molecular types respectively, and at least one servo-control loop which includes electronic means that enable an error signal to be produced by comparison of said signal with a predetermined value of said flux to be controlled as a function of said error signal.

2. A system as claimed in claim 1, wherein each unit for evaporating a molecular jet includes means for electrical heating, said servo-control loop comprising an integrator divider, a regulator and a control system for said electrical heating means.

3. A system as claimed in claim 2, wherein said mass sweep device includes a probe containing a four-pole structure fitted in said vacuum enclosure and external analyzer drawer.

4. A system as claimed in claim 1, wherein two servo-control loops are included, said system comprising an electric signal comparator able to measure the molecular flux content for two different types, the comparison signal being able to act on said electronic means to keep the ratio of the two molecular flux contents constant.

5. A co-evaporation method using a system as claimed in claim 4, wherein said system comprises two units able to evaporate gallium and arsenic respectively.

6. A system as claimed in claim 4, wherein it includes two servo-controls loops A and B, said loop A comprising an integrator divider connected to a first output of said peak selector, a regulator and a control system, and said loop B comprising an integrator divider connected to a second output of said peak selector, a comparator, a regulator and a control system.

* * * * *